(12) United States Patent
Wang et al.

(10) Patent No.: US 11,468,800 B2
(45) Date of Patent: Oct. 11, 2022

(54) BACK-FILM STRUCTURE, FLEXIBLE DISPLAY PANEL AND DISPLAY DEVICE

(71) Applicant: BOE TECHNOLOGY GROUP CO., LTD., Beijing (CN)

(72) Inventors: Tao Wang, Beijing (CN); Song Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 87 days.

(21) Appl. No.: 17/043,745

(22) PCT Filed: Apr. 29, 2020

(86) PCT No.: PCT/CN2020/087856
§ 371 (c)(1),
(2) Date: Sep. 30, 2020

(87) PCT Pub. No.: WO2020/224506
PCT Pub. Date: Nov. 12, 2020

(65) Prior Publication Data
US 2021/0366320 A1    Nov. 25, 2021

(30) Foreign Application Priority Data
May 9, 2019   (CN) .......................... 201910384045.6

(51) Int. Cl.
*G09F 9/30* (2006.01)
*H01L 51/00* (2006.01)
*H01L 51/52* (2006.01)

(52) U.S. Cl.
CPC .......... *G09F 9/301* (2013.01); *H01L 51/0097* (2013.01); *H01L 51/5246* (2013.01); *H01L 2251/558* (2013.01)

(58) Field of Classification Search
CPC .. G09F 9/301; H01L 51/0097; H01L 51/5246
(Continued)

(56) References Cited

U.S. PATENT DOCUMENTS

| 6,789,262 | B1 | 9/2004 | Leiber et al. |
| 9,992,881 | B2 | 6/2018 | Choi et al. |

(Continued)

FOREIGN PATENT DOCUMENTS

| CN | 204198139 | 3/2015 |
| CN | 106601131 | 4/2017 |

(Continued)

OTHER PUBLICATIONS

Office action from Chinese Application No. 201910384045.6 dated Aug. 5, 2020.
(Continued)

*Primary Examiner* — Prabodh M Dharia
(74) *Attorney, Agent, or Firm* — Calfee, Halter & Griswold LLP

(57) ABSTRACT

A back-film structure may include a first back-film portion which serves as a first circle upon rolling and a second back-film portion arranged side by side with the first back-film portion in the rolling direction, wherein a thickness of the first back-film portion increases in the rolling direction. This solution can ensure that the inner surface of the tail end of the first back-film portion is located as close as possible to the inner surface of the head end of the first back-film portion after the rolling.

14 Claims, 3 Drawing Sheets

(58) Field of Classification Search
USPC .......................................... 345/205; 174/251
See application file for complete search history.

(56) References Cited

U.S. PATENT DOCUMENTS

| | | | |
|---|---|---|---|
| 2015/0382446 A1* | 12/2015 | Kwon ..................... | H05K 1/147 |
| | | | 174/251 |
| 2017/0332496 A1* | 11/2017 | Choi ........................ | G09F 9/301 |
| 2018/0265750 A1* | 9/2018 | Akamatsu .................. | C09J 5/00 |
| 2019/0208300 A1* | 7/2019 | Lee ........................ | H04R 9/025 |
| 2019/0297736 A1 | 9/2019 | Xu et al. | |
| 2020/0133335 A1* | 4/2020 | Wu ........................ | G06V 40/18 |
| 2020/0154580 A1* | 5/2020 | Shin .................. | G02F 1/133305 |
| 2020/0272202 A1* | 8/2020 | Wang ....................... | G09F 9/301 |

FOREIGN PATENT DOCUMENTS

| | | |
|---|---|---|
| CN | 107369383 | 11/2017 |
| CN | 208061588 | 11/2018 |
| CN | 110322791 | 10/2019 |
| EP | 1196915 A1 | 4/2002 |
| EP | 1196915 B1 | 9/2003 |
| JP | 2005126182 | 5/2005 |

OTHER PUBLICATIONS

International Search Report and Written Opinion from PCT/CN2020/087856 dated Jul. 29, 2020.

* cited by examiner

BACK-FILM STRUCTURE, FLEXIBLE DISPLAY PANEL AND DISPLAY DEVICE

CROSS-REFERENCE

This application is based on International Application No. PCT/CN2020/087856, filed on Apr. 29, 2020, which is based upon and claims priority to Chinese Patent Application No. 201910384045.6, filed on May 9, 2019, the entire contents of which are incorporated herein by reference in its entirety.

TECHNICAL FIELD

The present disclosure generally relates to display technology, and more particularly, to a back-film structure, a flexible display panel and a display device.

BACKGROUND

With the development of display technology, flexible display panels have become more and more widely used. Stretchable, rollable, foldable flexible display panels are being expected by people.

Currently, since the flexible display panel has an overall thickness, when the flexible display panel is rolled, there will be a segment difference between the head end and the tail end for the first circle upon rolling. The segment difference is a hidden danger to the life of the flexible display panel, thus reducing the reliability of the flexible display panel is reduced.

It should be noted that information disclosed in this part are provided only for acquiring a better understanding of the background of the present application and therefore may include information that is not current technology already known to those of ordinary skill in the art.

SUMMARY

According to a first aspect of the present application, there is provided a back-film structure for a flexible display panel, wherein the flexible display panel comprises a rollable display device, wherein the back-film structure comprises: a first back-film portion provided on one side of the display device; a second back-film portion provided on the same side of the display device as the first back-film portion; wherein a thickness of the first back-film portion gradually decreases in a direction distal to the second back-film portion.

In an exemplary embodiment of the present application, the first back-film portion comprises a first back-film adhesive layer and a first back-film substrate layer, wherein the first back-film adhesive layer is provided on one side of the display device, and the first back-film substrate layer is provided on one side of the first back-film adhesive layer distal to the display device; wherein a thickness of the first back-film adhesive layer gradually decreases in a direction distal to the second back-film portion.

In an exemplary embodiment of the present application, the first back-film adhesive layer comprises a first bonding surface and a second bonding surface opposite to each other, wherein the first bonding surface is bonded to the display device, and the second bonding surface is bonded to the first back-film substrate layer; wherein the first bonding surface is a plane and the second bonding surface is an arc surface.

In an exemplary embodiment of the present application, the first back-film adhesive layer comprises a first bonding surface and a second bonding surface opposite to each other, wherein the first bonding surface is bonded to the display device, and the second bonding surface is bonded to the first back-film substrate layer; wherein the first bonding surface is a plane and the second bonding surface is a step surface.

In an exemplary embodiment of the present application, various portions of the first back-film adhesive layer have a thickness in the range of 15 μm to 150 μm.

In an exemplary embodiment of the present application, the first back-film portion is configured to form a first circle upon rolling the display device.

In an exemplary embodiment of the present application, the second back-film portion comprises a second back-film adhesive layer and a second back-film substrate layer, wherein the second back-film adhesive layer is provided on one side of the display device, and the second back-film substrate layer is provided on one side of the second back-film adhesive layer distal to the display device; wherein the second back-film adhesive layer and the first back-film adhesive layer are in a connected state.

In an exemplary embodiment of the present application, the second back-film substrate layer and the first back-film substrate layer are in a disconnected state.

In an exemplary embodiment of the present application, a thickness of the second back-film substrate layer is equal to a thickness of the first back-film substrate layer.

In an exemplary embodiment of the present application, a thickness of the second back-film portion remains unchanged.

In an exemplary embodiment of the present application, the thickness of the second back-film portion is smaller than the maximum thickness of the first back-film portion.

According to a second aspect of the present disclosure, there is provided a flexible display panel, comprising: a display device and a back-film structure provided on one side of the display device, the back-film structure being the back-film structure according to any one of the above.

According to a third aspect of the present disclosure, there is provided a display device, comprising: the aforementioned flexible display panel.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments consistent with the invention and, together with the description, serve to explain the principles of the invention. Apparently, the drawings in the following description are only for illustrating some embodiments of the present disclosure and those of ordinary skill in the art can also derive other drawings based on the drawings without paying any creative labor.

DETAILED DESCRIPTION

Figure 1:
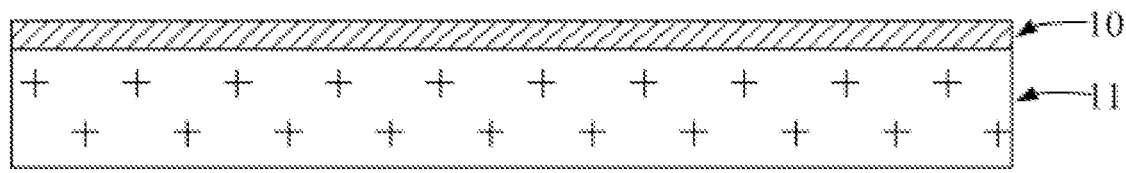
FIG. 1 is a schematic structural diagram illustrating a flexible display panel in the related art.

Exemplary embodiments will now be described more fully with reference to the accompanying drawings. However, the exemplary embodiments may be embodied in a variety of forms and should not be construed as being limited to the embodiments set forth herein. On the contrary, the embodiments are provided to make the present disclosure comprehensive and through and to fully convey the concept of the exemplary embodiments to those skilled in the art. The same reference signs in the drawings denote the same or similar structures, and detailed descriptions thereof will be omitted.

Although terms having opposite meanings such as "up" and "down" are used herein to describe the relationship of one component relative to another component, such terms are used herein only for the sake of convenience, for example, "in the direction illustrated in the figure". It can be understood that if a device denoted in the drawings is turned upside down, a component described as "above" something will become a component described as "under" something. When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others. Terms "first", "second" are used herein only as markers, and they do not limit the number of objects modified after them.

Organic Light-Emitting Diode (OLED) display panels are considered to be the most promising flat-panel display panels in the contemporary era, and are also considered to be display technologies by which flexible display panels are most likely to be manufactured.

Flexible display panels have been widely used in commercial products since they are light and thin, and deformable. Screens that are bendable toward both sides, notch screens, and waterdrop screens on the market are all manufactured by processing flexible display panels.

At present, stretchable, rollable, and foldable flexible display panels are being expected by people. As shown in FIG. 1, the flexible display panel usually includes a display device 10 and a back-film structure 11 located on the back of the display device 10. It should be noted that there are two ways to roll the flexible display panel, the first one is to roll the flexible display panel with the display device 10 serving as the inner ring and the back-film structure 11 serving as the outer ring; and the second one is to roll the flexible display panel with the display device 10 serving as the outer ring and the back-film structure 11 serving as the inner ring. The second one is a commonly-used rolling way.

Figure 2:
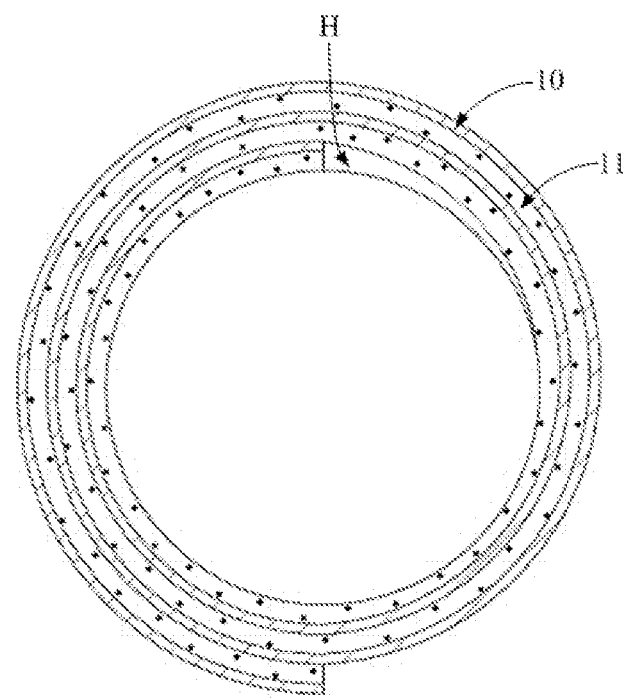
FIG. 2 is a schematic structural diagram illustrating a flexible display panel after being rolled in the related art.

As shown in FIG. 2, there will be a segment difference H between the head end and the tail end for the first circle upon the rolling of the flexible display panel due to its thickness. Namely, the inner surface of the tail end is located outside the outer surface of the head end for the first circle upon rolling and spacing between the inner surface of the tail end and the inner surface of the head end for the first circle upon rolling is the segment difference H, which is a hidden danger to the service life of the flexible display panel, thus reducing the reliability of the flexible display panel. The first circle refers to a circle that is first rolled up when the panel is rolled from a flat state to a winding state, and it is also the innermost circle upon the rolling of the entire panel.

The display device 10 and the back-film structure 11 are one of the causes of the segment difference in the flexible display panel. Therefore, in order to avoid the generation of the segment difference, it is required to process at least one of the display device 10 and the back-film structure 11. However, since structures such as a circuit layer and a light-emitting layer included in the display device 10 cannot be processed, the back-film structure 11 will be preferably improved in the present disclosure, in order to avoid the segment difference between the head end and the tail end for the first circle upon the rolling of the flexible display panel. Namely, the back-film structure 11 may be divided into different portions and processed.

Specifically, as shown in FIGS. 3 to 7, an embodiment of the present disclosure provides a back-film structure 21 which is applied to a flexible display panel. It is worth noting that the back-film structure 21 is used as the inner ring of the flexible display panel and a display device 20 of the flexible display panel is used as the outer ring when the flexible display panel is rolled. The back-film structure 21 includes a first back-film portion 210 (the portion as defined by the dotted line A to dotted line B in FIGS. 3 to 6) which is served as the first circle upon rolling and a second back-film portion 211 (the portion as defined by the dashed line B to the dashed line C in FIGS. 3 to 6) arranged side by side with the first back-film portion 210 in the rolling direction (direction X as shown in FIGS. 3 to 6).

Figure 7:
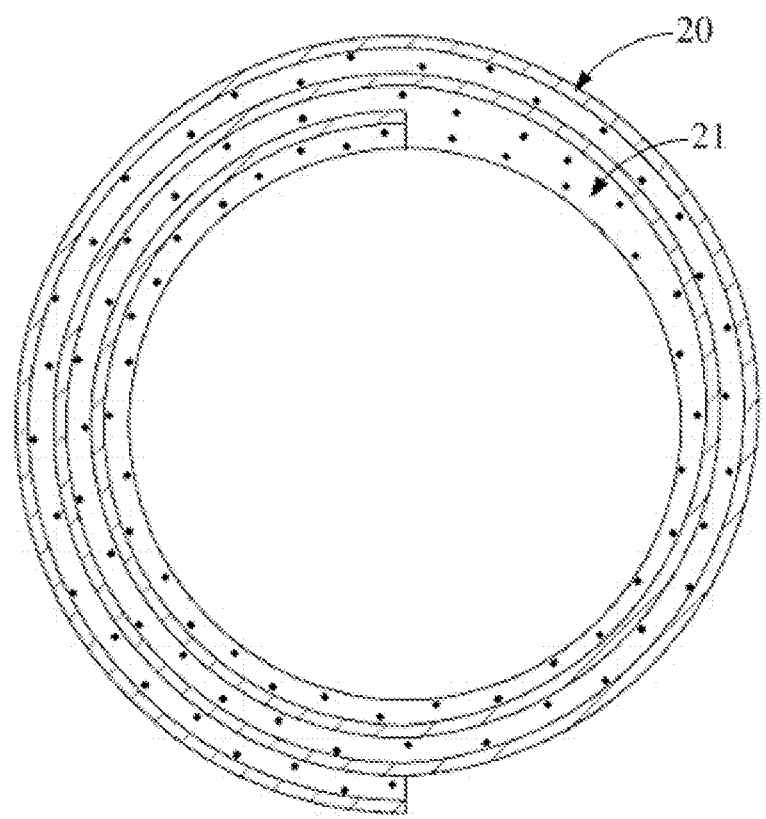
FIG. 7 is a schematic structural diagram illustrating the flexible display panel after being rolled according to an embodiment of the present disclosure.

The first back-film portion 210 has a thickness which increases toward the rolling direction. The increasing thickness of the first back-film portion 210 which serves as the first circle upon rolling toward the rolling direction ensures that the inner surface of the tail end of the first back-film portion 210 is located as close as possible to the inner surface of the head end of the first back-film portion 210 after the rolling. Furthermore, it also ensures that the inner surface at the tail end of the first back-film portion 210 and the inner surface at the head end of the first back-film portion 210 are spliced to form an arc surface (the arc surface is a circular arc surface or an elliptical arc surface) after the rolling, as shown in FIG. 7, which avoids a segment difference between the head end and tail end for the first circle upon rolling. Namely, the segment difference between the head end and tail end of the first circle upon rolling is filled, thus ensuring the flatness of the bottom surface during subsequent rolling (that is, the rolling of the second back-film portion 211) as well as the effect of the subsequent rolling. In addition, since the segment difference between the head end and tail end for the first circle upon rolling is filled by the back-film structure, the display device 20 may be prevented from dislocating and bending toward the inside of the rolling between the head end and tail end for the first circle upon rolling, which ensures the reliability of the display device 20 in the rolled state. Therefore, the service life of the entire flexible display panel and the display device is prolonged and the reliability of the flexible display panel and the display device is improved.

Figure 3:
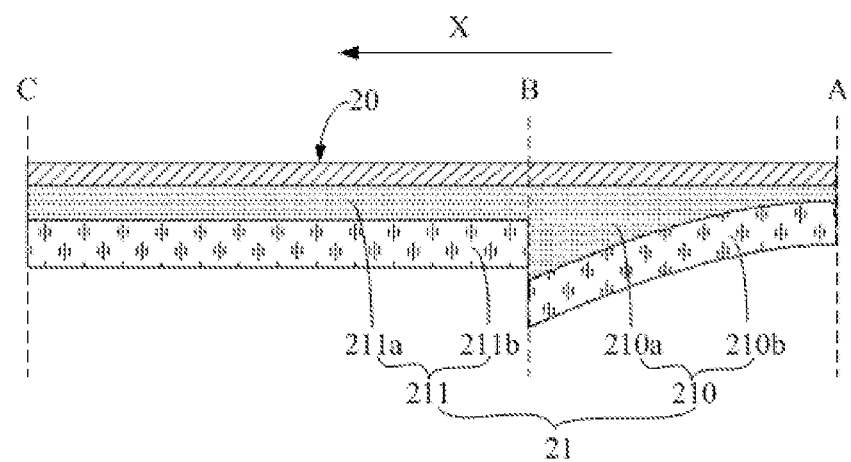
FIG. 3 is a schematic structural diagram illustrating a back-film structure and a display device after assembly according to an embodiment of the present disclosure.
Figure 4:
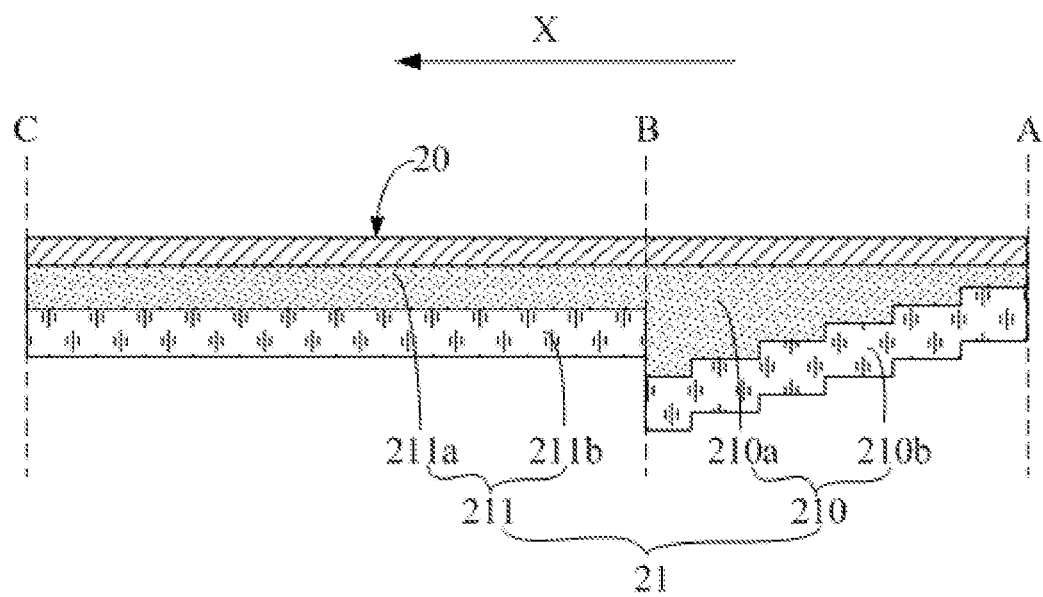
FIG. 4 is a schematic structural diagram illustrating a back-film structure and a display device after assembly according to another embodiment of the present disclosure.

The thickness of the second back-film portion 211 remains unchanged in the rolling direction, which not only reduces the processing difficulty of the back-film structure 21 but also ensures the subsequent rolling effect. Optionally, as shown in FIGS. 3 and 4, the second back-film portion 211 may have a thickness which is less than the maximum thickness of the first back-film portion 210 (that is, the thickness of the tail end of the first back-film portion 210). After the back-film structure is rolled, as shown in FIG. 7, the head end surface of the first back-film portion 210 abuts against an area on the tail end surface of the first back-film portion 210, which protrudes from the second back-film portion 211, which can not only ensure the subsequent rolling effect but also provide more space for design and installation for the display device of the flexible display panel using the back-film structure 21, thus improving the application flexibility of the flexible display panel having the back-film structure 21.

Optionally, the back-film structure 21 can be formed on one side of the display device 20 by bonding as a whole. Specifically, the back-film structure 21 may include an adhesive layer and a substrate layer. The substrate layer is adhered to the display device 20 on one side through the adhesive layer to support and protect the display device 20. As mentioned above, since the entire back-film structure 21 may be divided into two portions, that is, the first back-film portion 210 and the second back-film portion 211, arranged in the rolling direction, when the entire back-film structure 21 is adhered to the display device 20 on one side by bonding, it may be appreciated that both the first back-film portion 210 and the second back-film portion 211 are adhered to the display device 20 on one side by bonding. In other words, the entire adhesive layer of the back-film structure 21 may be divided into a first back-film adhesive layer 210a and a second back-film adhesive layer 211a, and the entire substrate layer of the back-film structure 21 may be divided into a first back-film substrate layer 210b and a second back-film substrate layer 211b. The first back-film portion 210 is consisted of the first back-film adhesive layer 210a and the first back-film substrate layer 210b. The first back-film substrate layer 210b can be bonded to the display device 20 on one side through the first back-film adhesive layer 210a. The second back-film portion 211 is consisted of the second back-film adhesive layer 211a and the second back-film substrate layer 211b. The second back-film substrate layer 211b can be adhered to the display device 20 on one side through the second back-film adhesive layer 211a.

For example, when the substrate layer of the back-film structure 21 is manufactured, a base material is usually processed to form a substrate layer by being stretched and extended into a film. The base material is polyethylene terephthalate (PET), polyethylene naphthalate (PEN), polyimide (PI) or the like. When the adhesive layer of the back-film structure 21 is manufactured, an adhesive with fluidity is usually coated on the substrate layer to form an adhesive layer. The adhesive may be at least one of a rubber pressure-sensitive adhesive and a resin pressure-sensitive adhesive. The rubber pressure-sensitive adhesive may be a natural rubber or a synthetic rubber. The resin rubber may be made of acrylic and silicone-based materials.

Since the adhesive layer has certain fluidity, the adhesive layer may be extended from the starting end to the finishing end under an adhering pressure, when the back-film structure 21 is adhered to the display device 20 on one side. Namely, the adhesive layer has a thickness which may be varied under the adhering pressure. Based on this, in this embodiment, the thickness of the first back-film adhesive layer 210a may be adjusted in order to cause a change in the thickness of the first back-film portion 210. In other words, in order to increase the thickness of the first back-film portion 210 in the rolling direction, the solution of increasing the thickness of the first back-film adhesive layer 210a in the rolling direction while keeping the thickness of the first back-film substrate layer 210b constant is adopted in this embodiment, which may reduce the difficulty in manufacturing the first back-film portion 210.

In detail, the starting end of the first back-film adhesive layer 210a may be the head end for the first circle upon rolling and the finishing end of the first back-film adhesive layer 210a may be the tail end for the first circle upon rolling. When the back-film structure 21 is adhered to the display device 20 on one side, the first back-film adhesive layer 210a may be extended from the starting end to the finishing end under the adhering pressure. Namely, a portion of the adhesive at the starting end slides toward the finishing end, so that the thickness of the first back-film adhesive layer 210a increases from the starting end to the finishing end. Namely, the thickness of the first back-film adhesive layer 210a is increased in the rolling direction.

Optionally, the first back-film adhesive layer 210a includes a first bonding surface and a second bonding surface opposite to each other, wherein the first bonding surface can be bonded to the display device 20 and the second bonding surface can be bonded to the first back-film substrate layer 210b. Since the surface of the display device 20 facing the back-film structure 21 is usually a plane, the first bonding surface may be designed as a plane to ensure a bonding area between the first bonding surface and the display device 20, thereby increasing the stability of bonding the first back-film portion 210 and the display device 20. In order to ensure that the thickness of the entire first back-film adhesive layer 210a increases in the rolling direction, the second bonding surface may be designed as an arc surface or a step surface.

For example, when the second bonding surface is an arc surface, the arc surface may protrude toward the first bonding surface to reduce the processing difficulty of the first back-film adhesive layer 210a.

For example, when the second bonding surface is a step surface, the step surface may include a horizontal surface parallel to the first bonding surface and a vertical surface perpendicular to the first bonding surface, but it is not limited thereto. The step surface may also include a plurality of inclined surfaces connected in sequence. The included angle between the inclined surface and the first bonding surface may be an acute angle. The adjacent inclined surfaces have different angles of inclination. Alternatively, the step surface may be consisted of a horizontal surface, a vertical surface and an inclined surface.

It should be noted that the second bonding surface is not limited to the above-mentioned arc surface or step surface, the second bonding surface may also be an oblique surface.

As mentioned above, the first back-film adhesive layer 210a of the first back-film portion 210 and the second back-film adhesive layer 211a of the second back-film portion 211 may be in a connected state to ensure the stability of bonding between the entire back-film structure 21 and the display device 20. Since the substrate layer of the back-film structure 21 is usually fabricated by being stretched and extended into a film, the thickness of the substrate layer of the back-film structure 21 will not change during the adhesion. Therefore, in this embodiment, the second back-film substrate layer 211b needs to be disconnected from the first back-film substrate layer 210b. That is to say, the second back-film substrate layer 211b and the first back-film substrate layer 210b are in a disconnected state, compared to the solution that the first back-film substrate layer and the second back-film substrate layer are in a connected state, in this embodiment, when the adhering pressure is applied to the first back-film portion 210 to cause a change in the thickness and shape of the first back-film adhesive layer 210a, the situation where the second back-film substrate layer 211b is misaligned with or peeled off the second back-film adhesive layer 211a which is caused by the applying of tensile force from the first back-film substrate layer 210b to the second back-film substrate layer 211b may be prevented. Optionally, the thickness of the first back-film substrate layer 210b may be equal to the thickness of the second back-film substrate layer 211b.

For example, various portions of the first back-film adhesive layer 210a may have a thickness ranging from 15 μm to 150 μm. In other words, a head end of the first back-film adhesive layer 210a (i.e., at the dotted line A in FIGS. 3 to 6) has a thickness not less than 15 μm, and a tail end of the first back-film adhesive layer 210a (i.e., at the dotted line B in FIGS. 3 to 6) has a thickness not exceeding 150 μm, which ensures not only the bonding performance of the first back-film adhesive layer 210a but also the degree to which the first back-film adhesive layer 210a bends. The thickness of the first back-film substrate layer 210b remains unchanged in the rolling direction, and the thickness of the first back-film substrate layer 210b may be in the range of 10 μm to 150 μm.

Figure 5:
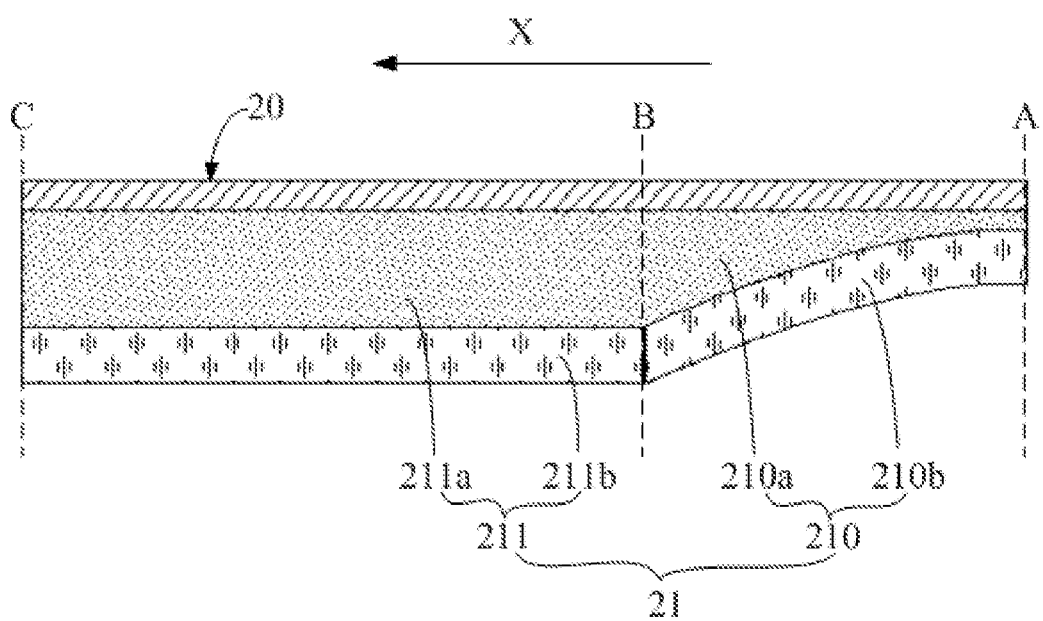
FIG. 5 is a schematic structural diagram illustrating a back-film structure and a display device after assembly according to another embodiment of the present disclosure.
Figure 6:
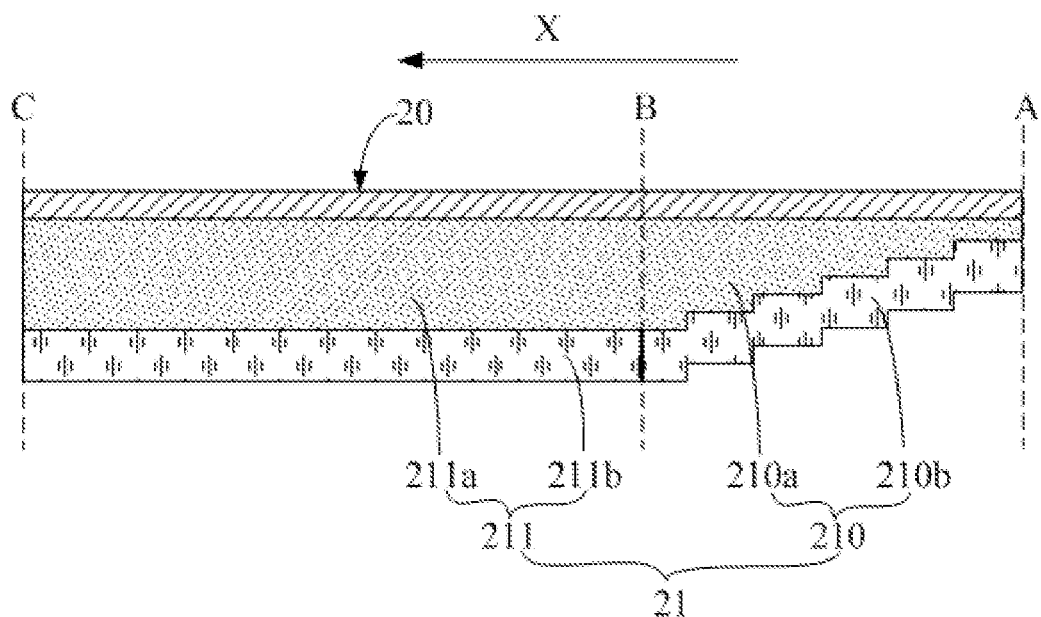
FIG. 6 is a schematic structural diagram illustrating a back-film structure and a display device after assembly according to another embodiment of the present disclosure.

It should be noted that since the aforementioned adhesive layer has a certain extensibility, and the first back-film substrate layer 210b is disconnected from the second back-film substrate layer 211b, in order to fill the segment difference between the head end and the tail end for the first circle upon rolling, as mentioned above, the overall thickness of the second back-film portion 211 is less than the maximum thickness of the first back-film portion 210, but it is not limited to this in this embodiment, it may also be greater than or equal to the overall thickness of the first back-film portion 210. As shown in FIGS. 5 and 6, when the thickness of the second back-film portion 211 is greater than or equal to the thickness of the first back-film portion 210, the head end for the first circle upon rolling may be rolled to the disconnection between the first back-film substrate layer 210b and the second back-film substrate layer 211b, and can squeeze the second back-film adhesive layer 211a of the second back-film portion 211, so that the head end and the tail end for the first circle upon rolling can abut against each other, to fill the segment difference between the head end and tail end for the first circle upon rolling.

Optionally, the thickness of the second back-film adhesive layer 211a remains unchanged in the rolling direction, and the thickness of the second back-film substrate layer 211b remains unchanged in the rolling direction.

An embodiment of the present disclosure further provides a flexible display panel. As shown in FIGS. 3 to 7, the flexible display panel may include: a display device 20 and a back-film structure 21 provided on one side of the display device 20. The back-film structure 21 is the back-film structure 21 described in any of the foregoing embodiments, and will not be elaborated here. The overall thickness of the display device 20 may be in the range of 10 μm to 100 μm. The display device 20 may be an OLED display device 20, but it is not limited thereto, and it may also be other types of display devices 20.

When the display device 20 is an OLED display device 20, the display device 20 may include a flexible substrate, an organic semiconductor switch, an OLED light-emitting component, an encapsulation layer, but it is not limited thereto. In addition, the flexible display panel may also include a circular polarizer, a touch unit, and a cover plate unit located on the encapsulation layer, as well as a heat dissipation structure and other functional layers on the side of the back-film structure 21 facing away from the display device 20. The heat dissipation structure and other functional layers are provided in divided regions, instead of being disposed on the back-film structure 21 in the form of the entire surface. When the back-film structure 21 is used as the inner ring of the flexible display panel, and the display device 20 of the flexible display panel is used as the outer ring, the heat dissipation structure and other functional layers will not have a significant effect on the rolling state. It should be noted that the various functional layers are attached to the display device 20 on both sides by means of adhesive.

The rolling radius of the flexible display panel may be in the range of 0.5 mm to 5 cm, but it is not limited to this, and the rolling radius may be determined according to the size and rolling requirements of the flexible display panel.

An embodiment of the present disclosure also provides a display device, which includes the flexible display panel described in any of the foregoing embodiments. The display device may be one of an e-reader, a mobile phone, a computer display screen, a billboard, and a television.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. A back-film structure for a flexible display panel, wherein the flexible display panel comprises a rollable display device, wherein the back-film structure comprises:
   a first back-film portion provided on one side of the display device; and
   a second back-film portion provided on the same side of the display device as the first back-film portion;
   wherein a thickness of the first back-film portion gradually decreases in a direction distal to the second back-film portion;
   the first back-film portion comprises a first back-film adhesive layer and a first back-film substrate layer, wherein the first back-film adhesive layer is provided on one side of the display device, and the first back-film substrate layer is provided on one side of the first back-film adhesive layer distal to the display device; wherein a thickness of the first back-film adhesive layer gradually decreases in a direction distal to the second back-film portion;
   the second back-film portion comprises a second back-film adhesive layer and a second back-film substrate layer, wherein the second back-film adhesive layer is provided on one side of the display device, and the second back-film substrate layer is provided on one side of the second back-film adhesive layer distal to the display device; and wherein the second back-film adhesive layer and the first back-film adhesive layer are in a connected state.

2. The back-film structure according to claim 1, wherein, the first back-film adhesive layer comprises a first bonding surface and a second bonding surface opposite to each other, wherein the first bonding surface is bonded to the display device, and the second bonding surface is bonded to the first back-film substrate layer;

wherein the first bonding surface is a plane and the second bonding surface is an arc surface.

3. The back-film structure according to claim 1, wherein, the first back-film adhesive layer comprises a first bonding surface and a second bonding surface opposite to each other, wherein the first bonding surface is bonded to the display device, and the second bonding surface is bonded to the first back-film substrate layer;

wherein the first bonding surface is a plane and the second bonding surface is a step surface.

4. The back-film structure according to claim 2, wherein, the first back-film portion is configured to form a first circle upon rolling the display device.

5. The back-film structure according to claim 1, wherein, various portions of the first back-film adhesive layer have a thickness in the range of 15 μm to 150 μm.

6. The back-film structure according to claim 1, wherein, the first back-film portion is configured to form a first circle upon rolling the display device.

7. The back-film structure according to claim 1, wherein, the second back-film substrate layer and the first back-film substrate layer are in a disconnected state.

8. The back-film structure according to claim 1, wherein, a thickness of the second back-film substrate layer is equal to a thickness of the first back-film substrate layer.

9. The back-film structure according to claim 1, wherein, a thickness of the second back-film portion remains unchanged.

10. The back-film structure according to claim 9, wherein, the thickness of the second back-film portion is smaller than the maximum thickness of the first back-film portion.

11. A flexible display panel, comprising: a display device and a back-film structure provided on one side of the display device, the back-film structure being the back-film structure according to claim 1.

12. A display device, comprising: the flexible display panel according to claim 11.

13. The flexible display panel according to claim 11, wherein,
the first back-film adhesive layer comprises a first bonding surface and a second bonding surface opposite to each other, wherein the first bonding surface is bonded to the display device, and the second bonding surface is bonded to the first back-film substrate layer;

wherein the first bonding surface is a plane and the second bonding surface is an arc surface.

14. The flexible display panel according to claim 11, wherein,
the first back-film adhesive layer comprises a first bonding surface and a second bonding surface opposite to each other, wherein the first bonding surface is bonded to the display device, and the second bonding surface is bonded to the first back-film substrate layer;

wherein the first bonding surface is a plane and the second bonding surface is a step surface.

* * * * *